(12) United States Patent
Ching et al.

(10) Patent No.: US 9,953,881 B2
(45) Date of Patent: Apr. 24, 2018

(54) METHOD OF FORMING A FINFET DEVICE

(71) Applicant: Taiwan Semiconductor Manufacturing Company, Ltd., Hsin-Chu (TW)

(72) Inventors: Kuo-Cheng Ching, Hsinchu County (TW); Ying-Keung Leung, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/803,260

(22) Filed: Jul. 20, 2015

(65) Prior Publication Data

US 2017/0025313 A1 Jan. 26, 2017

(51) Int. Cl.
H01L 21/8238 (2006.01)
H01L 21/84 (2006.01)
H01L 29/66 (2006.01)
H01L 21/02 (2006.01)
H01L 27/12 (2006.01)
(Continued)

(52) U.S. Cl.
CPC ........... *H01L 21/823807* (2013.01); *H01L 21/02123* (2013.01); *H01L 21/02236* (2013.01); *H01L 21/02255* (2013.01); *H01L 21/823821* (2013.01); *H01L 21/823878* (2013.01); *H01L 21/845* (2013.01); *H01L 27/092* (2013.01); *H01L 27/1207* (2013.01); *H01L 29/66545* (2013.01); *H01L 2029/7858* (2013.01)

(58) Field of Classification Search
None
See application file for complete search history.

(56) References Cited

U.S. PATENT DOCUMENTS 7,425,740 B2   9/2008  Liu et al.
8,048,723 B2  11/2011  Chang et al.
(Continued)

FOREIGN PATENT DOCUMENTS

CH   104733311   *  6/2015
CN   104733311      6/2015
(Continued)

OTHER PUBLICATIONS

Taiwan Office Action issued Jun. 27, 2016 in Patent Application No. 10520787280.
(Continued)

*Primary Examiner* — Daniel Whalen
(74) *Attorney, Agent, or Firm* — Haynes and Boone, LLP

(57) ABSTRACT

The present disclosure provides a method, which includes forming a first fin structure and a second fin structure over a substrate, which has a first trench positioned between the first and second fin structures. The method also includes forming a first dielectric layer within the first trench, recessing the first dielectric layer to expose a portion of the first fin structure, forming a first capping layer over the exposed portion of the first fin structure and the recessed first dielectric layer in the first trench, forming a second dielectric layer over the first capping layer in the first trench while the first capping layer covers the exposed portion of the first fin feature and removing the first capping layer from the first fin structure.

20 Claims, 21 Drawing Sheets

(51) Int. Cl.
*H01L 27/092* (2006.01)
*H01L 29/78* (2006.01)

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2007/0111419 A1 | 5/2007 | Doyle et al. |
| 2008/0029828 A1 | 2/2008 | Oh et al. |
| 2008/0142841 A1 | 6/2008 | Lindert et al. |
| 2013/0196478 A1* | 8/2013 | Chang ............ H01L 29/7853 438/283 |
| 2013/0285153 A1 | 10/2013 | Lee et al. |
| 2014/0183600 A1 | 7/2014 | Huang et al. |
| 2014/0197457 A1* | 7/2014 | Wang ............. H01L 29/785 257/192 |
| 2014/0264590 A1 | 9/2014 | Yu et al. |
| 2014/0264592 A1 | 9/2014 | Oxland et al. |
| 2015/0028426 A1* | 1/2015 | Ching ............ H01L 29/785 257/401 |

FOREIGN PATENT DOCUMENTS

| | | |
|---|---|---|
| KR | 20140042622 | 4/2014 |
| TW | 201601257 | 1/2016 |
| WO | WO2015/054913 | 4/2015 |

OTHER PUBLICATIONS

Translated Office Action dated Nov. 3, 2016, International Application No. KR10-2015-0162350, 12 pages.

* cited by examiner

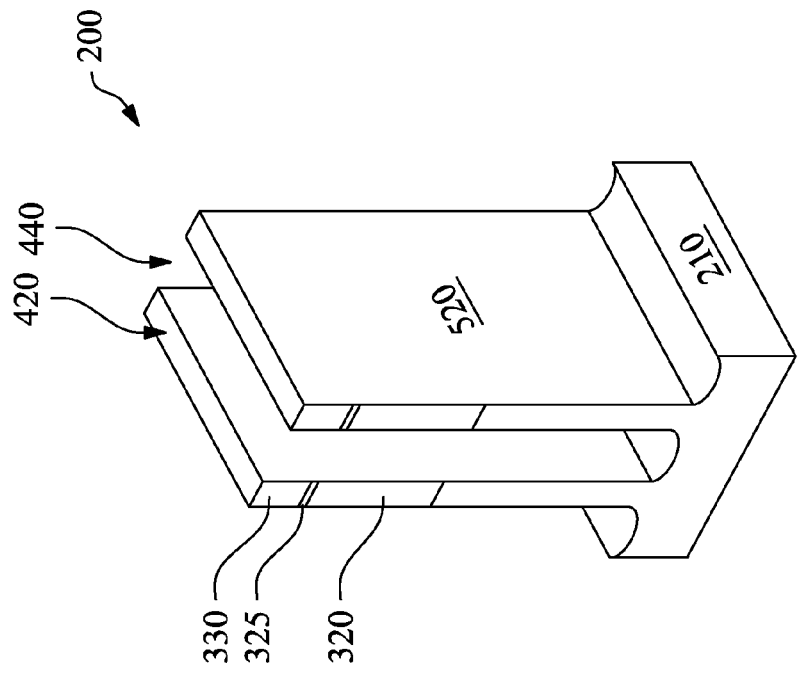
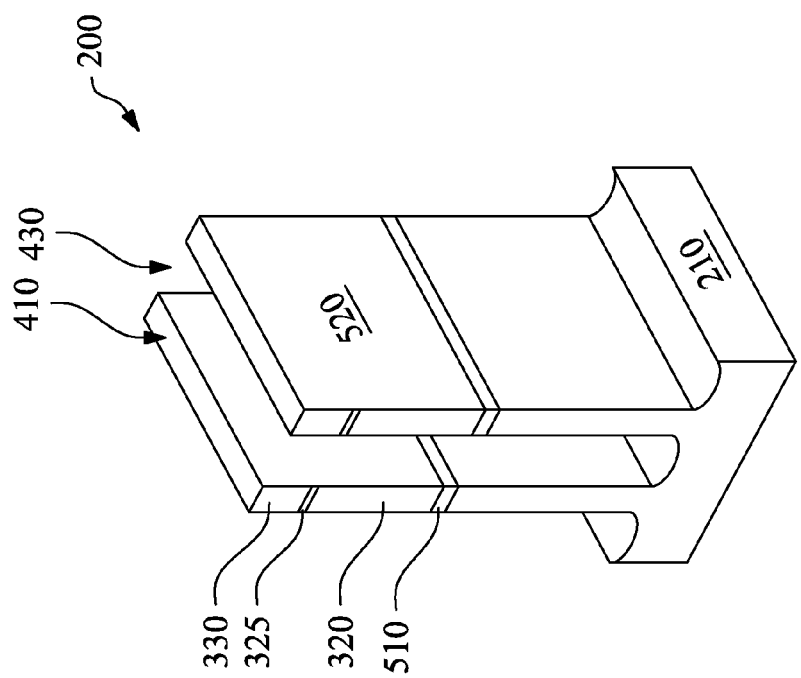
FIG. 7A
FIG. 7B

METHOD OF FORMING A FINFET DEVICE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Furthermore, epitaxy growth, such as silicon germanium, is also introduced to transistors. Although existing FinFET devices and methods of fabricating FinFET devices have been generally adequate for their intended purposes, they have not been entirely satisfactory in all respects. For example, challenges rise to avoid adverse impacts on fin structure during the formation of isolation regions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13a, 13B, 14A, 14B, 15A, 15B, 16A, 16B, 17A, 17B, 18A, 18B, 19A and 19B are diagrammatic perspective views of an example semiconductor device undergoing processes in accordance with some embodiments.

DETAILED DESCRIPTION

Figure 1:
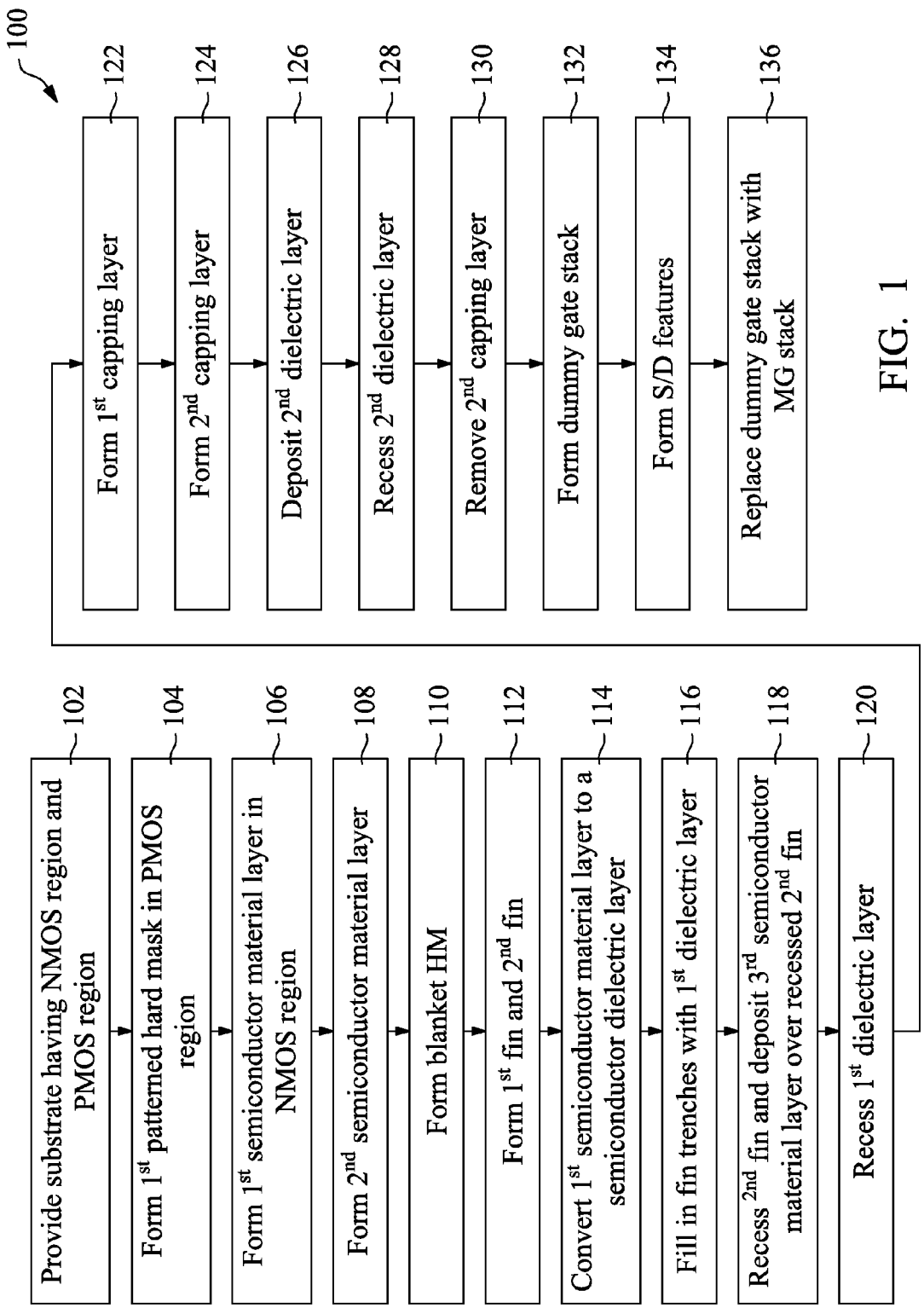
FIG. 1 is a flow chart of an example method for fabricating a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a semiconductor device 200 according to aspects of the present disclosure. FIGS. 2A through 19B are side-perspective views of the semiconductor device 200 manufactured according to the method 100. FIGS. 20A-21A are cross-section views of the semiconductor device 200 manufactured according to the method 100. In FIGS. 2A through 21A, figures ending with an "A" designation illustrate a first region of the semiconductor device 200; figures ending with a "B" designation illustrate a second region. In the present embodiment, the first region is an NMOS region and the second region is a PMOS region.

Figure 2B:
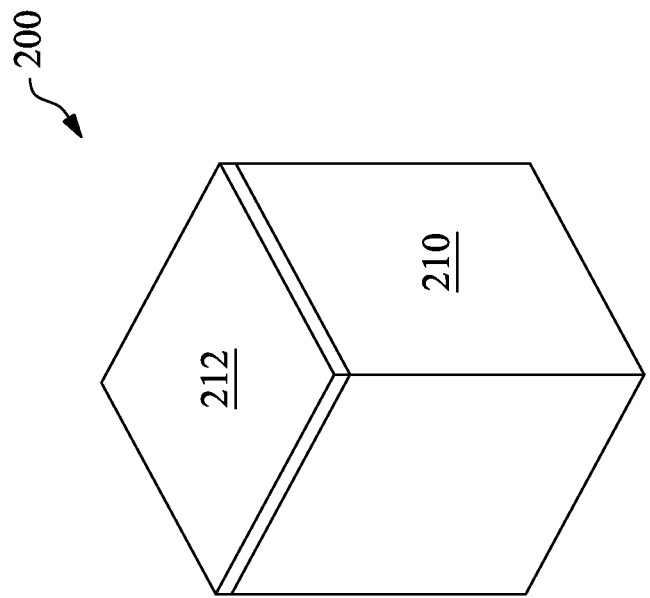
Figure 2A:
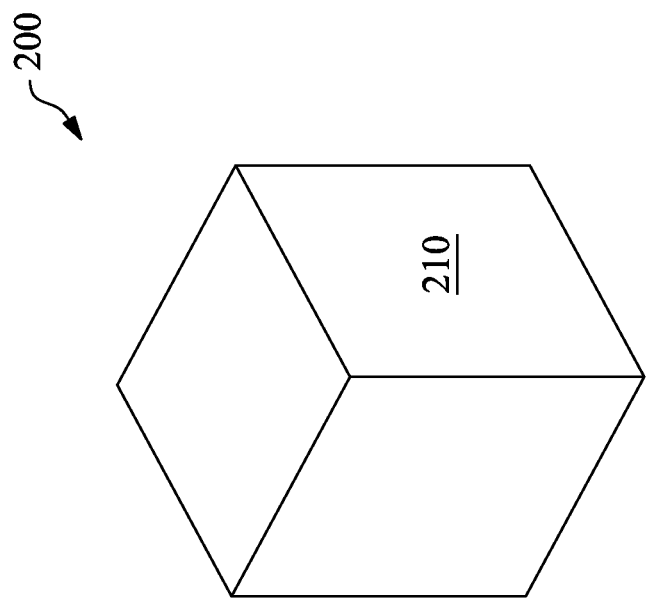

Referring to FIGS. 1 and 2A-2B, the method 100 begins at operation 102 by providing a substrate 210. In the present embodiment, the substrate 210 is a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

The substrate 210 may include integrated circuit devices (not shown). As one of ordinary skill in the art will recognize, a wide variety of integrated circuit devices such as transistors, diodes, capacitors, resistors, the like, and/or combinations thereof may be formed in and/or on the substrate 210 to generate the structural and functional requirements of the design for the FinFET. The integrated circuit devices may be formed using any suitable methods.

Referring again to FIGS. 1 and 2A-2B, the method 100 proceeds to step 104 by forming a first patterned hard mask (HM) 212 to cover the PMOS region while leaving the NMOS region uncovered. The first patterned HM 212 may be formed by processes including depositing, patterning and etching. The first patterned HM 212 may include silicon oxide, silicon nitride, silicon oxynitride, or any other suitable dielectric material, formed by thermal oxidation, chemical vapor deposition (CVD), atomic layer deposition (ALD), or any other appropriate method.

Figure 3B:
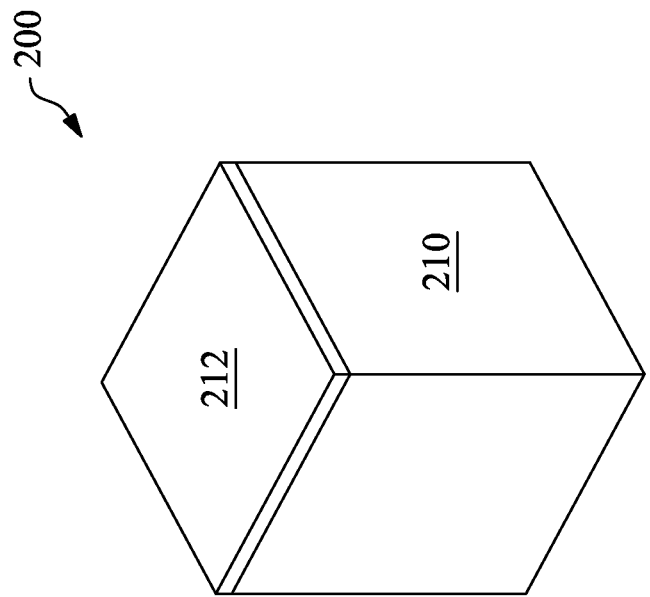
Figure 3A:
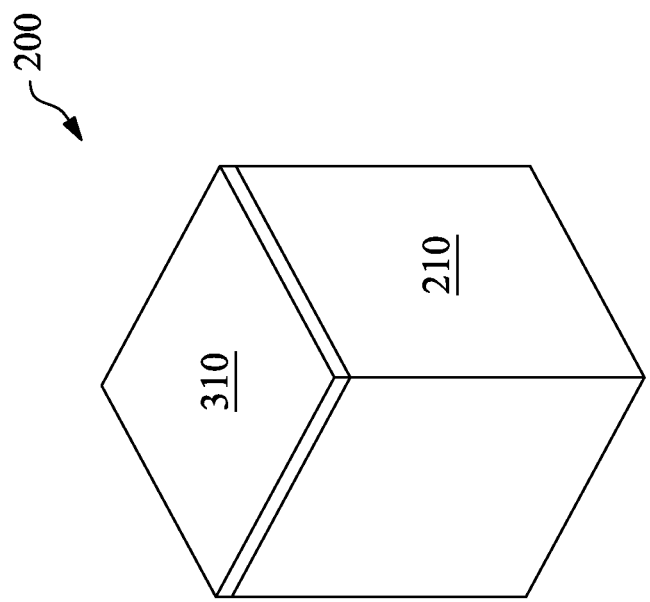

Referring to FIGS. 1 and 3A-3B, the method 100 proceeds to step 106 by forming a first semiconductor material layer 310 over the substrate 210 in the NMOS region while the PMOS region is covered by the first patterned HM 212. In the present embodiment, the first semiconductor material layer 310 is deposited by an epitaxial growth. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes. The first semiconductor material layer 310 and the semiconductor material of substrate 210 are different from each other. In the present embodiment, the first semiconductor material layer 310 includes silicon germanium (SiGe). In various examples, the first semiconductor material layer 310 may include germanium (Ge), silicon (Si), gallium arsenide (GaAs), aluminum gallium arsenide (AlGaAs), silicon germanium (SiGe), gallium arsenide phosphide (GaAsP), or other suitable materials.

Figure 4B:
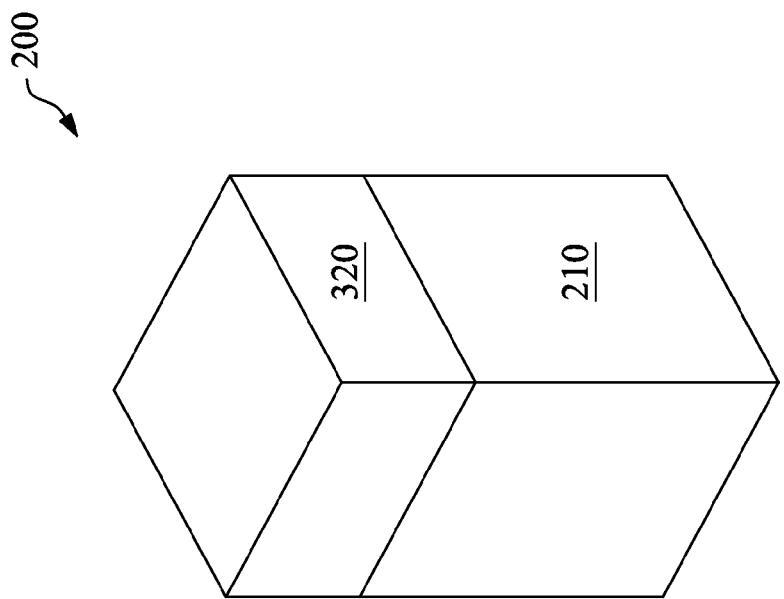
Figure 4A:
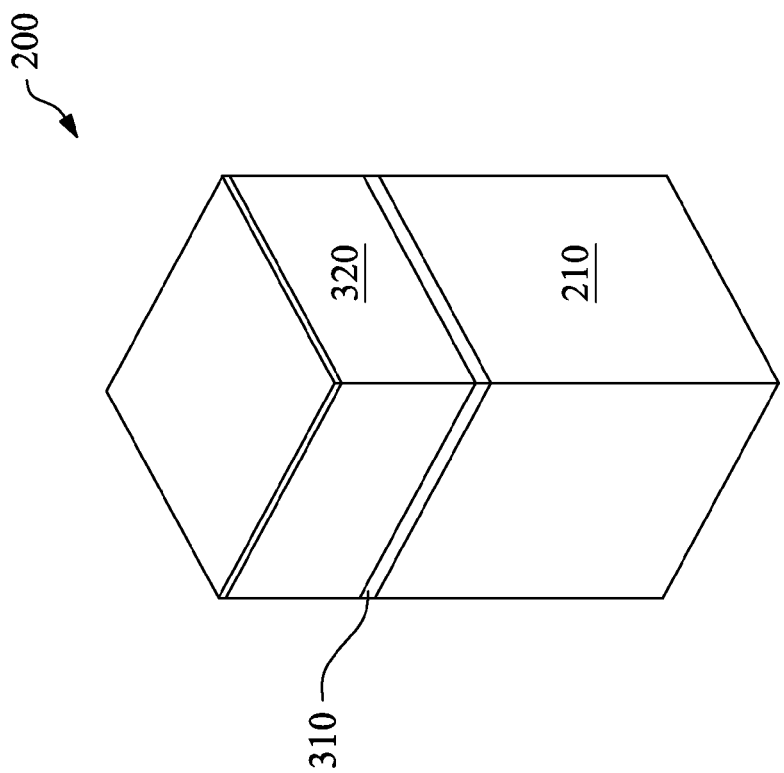

Referring to FIGS. 1 and 4A-4B, the method 100 proceeds to step 108 by forming a second semiconductor material layer 320 over the first semiconductor material layer 310 in the NMOS region and over the substrate 210 in the PMOS region. Prior to forming the second semiconductor material layer 320, the first patterned HM 212 is removed by an etching process, such as a selective wet etch. The first and second semiconductor material layers, 310 and 320, are different from each other. In the present embodiment, the first semiconductor material layer 310 includes SiGe while the second semiconductor material layer 320 includes Si. In various examples, the second semiconductor material layer 320 may include Ge, GaAs, AlGaAs, SiGe, GaAsP, or other suitable materials. The second semiconductor material layer 320 is formed similarly in many respects to the first semiconductor material layer 310 discussed above in association with FIGS. 3A-3B.

Figure 5B:
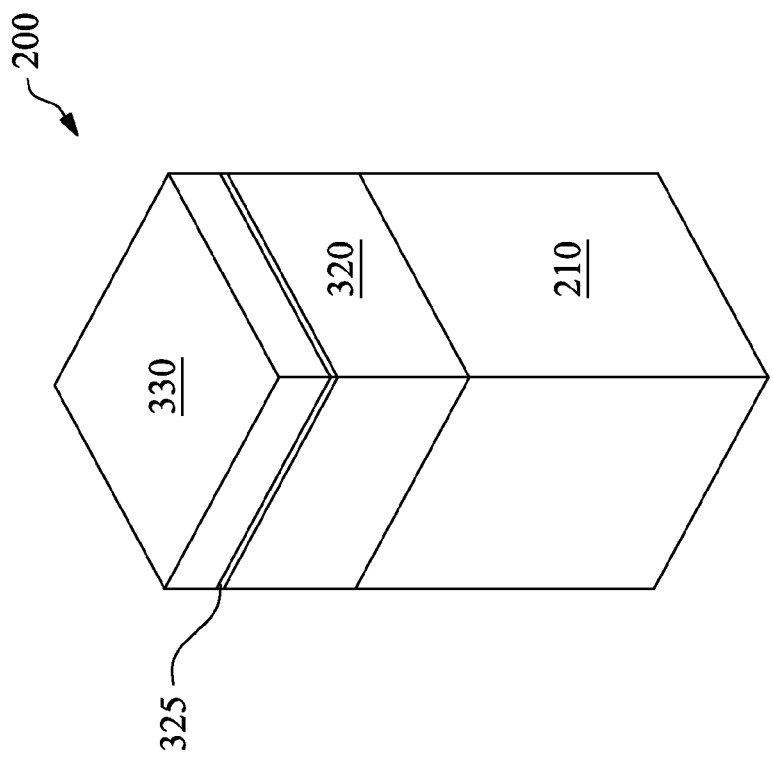
Figure 5A:
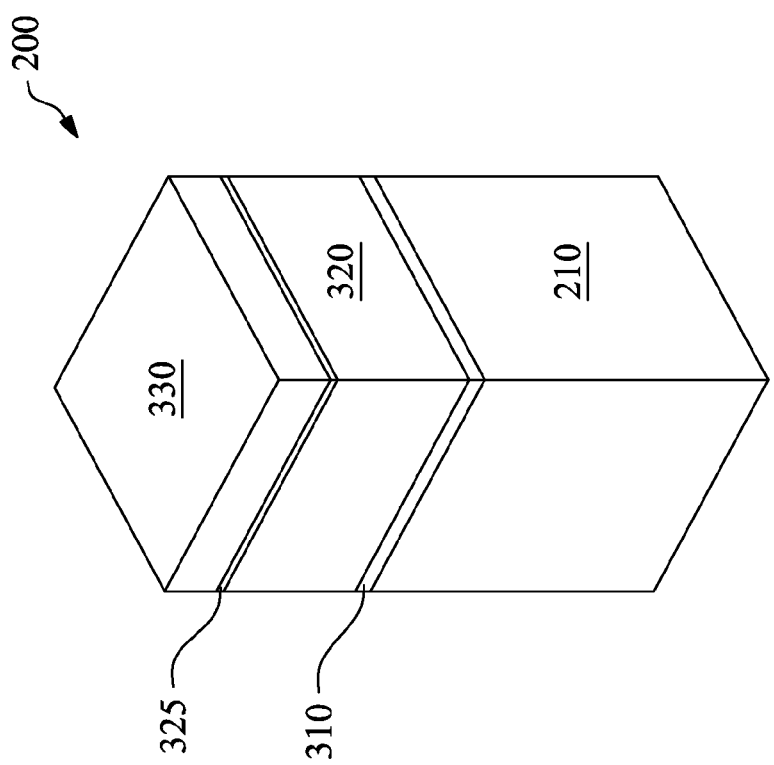

Referring to FIGS. 1 and 5A-5B, the method 100 proceeds to step 110 by forming a blanket HM 330 over the second semiconductor material layer 320 in both the NMOS region and the PMOS region. The blanket HM 330 may include silicon nitride, silicon oxynitride, silicon carbide, silicon carbon nitride, the like, or a combination thereof. In some embodiments, prior to depositing the blanket HM 330, a pad oxide layer 325 is deposited over the second semiconductor material layer 320 first to provide a stress buffer between the second semiconductor material layer 320 and the blanket HM 330. The blanket HM 330, as well as the pad oxide layer 325, may be formed by CVD, PVD, ALD, or other proper techniques.

Figure 6B:
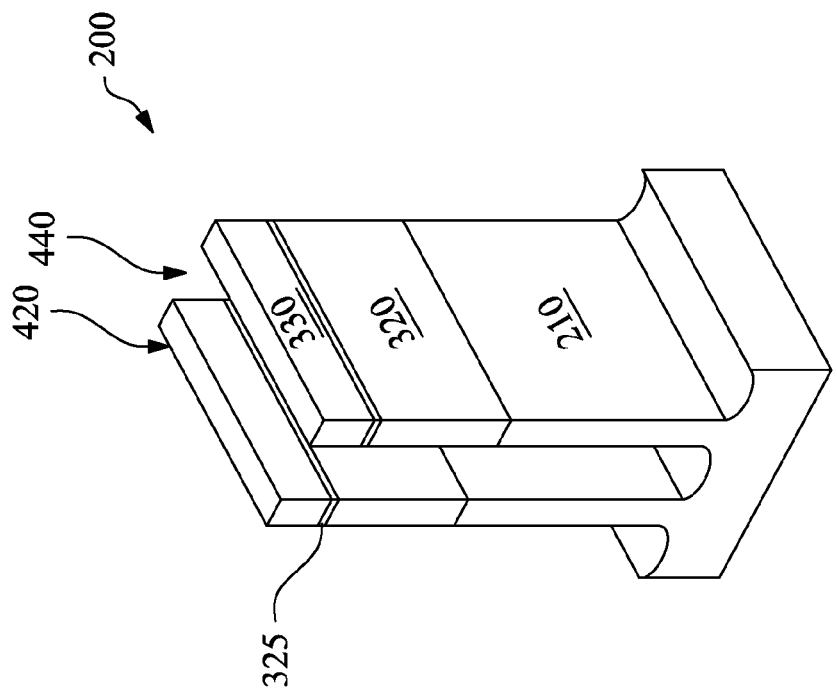
Figure 6A:
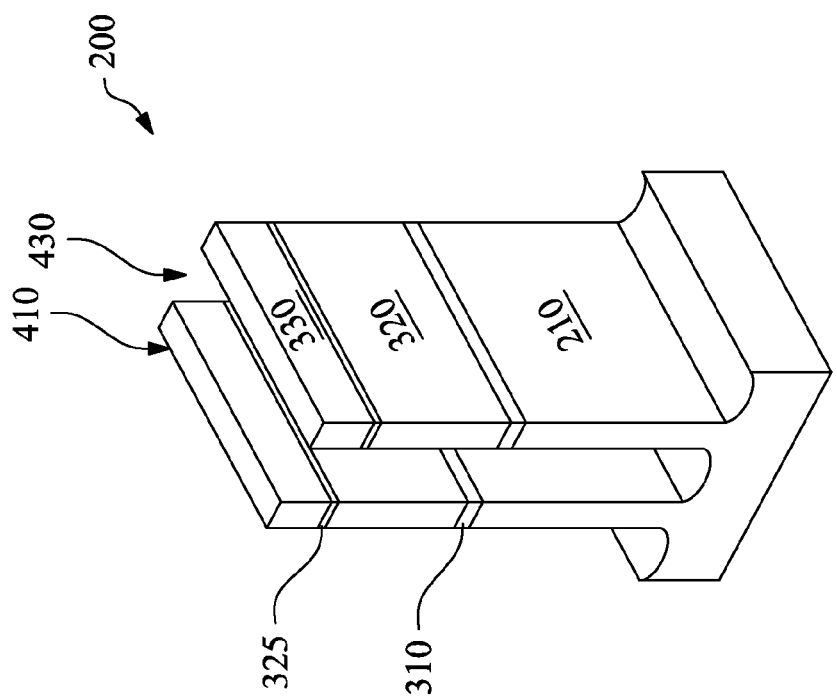

Referring to FIGS. 1 and 6A-6B, the method 100 proceeds to step 112 by forming first fins 410 in the NMOS region and second fins 420 in the PMOS region, as well as fin trench 430 between first fins 410 and fin trench 440 between second fins 420. The first and second fins, 410 and 420, are formed by etching the blanket HM 330 (as well as the pad oxide layer 325 if present), the second and first semiconductor material layers, 320 and 310, and the substrate 210.

The etching process may include a wet etch, a dry etch, or a combination thereof. In one embodiment, the wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. In another embodiment, the dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

Alternatively, a patterned photoresist layer is formed over the blanket HM 330 and the blanket HM 330 is then etched through the patterned photoresist layer to pattern the blanket HM 330. After patterning the blanket HM 330, the patterned photoresist layer is removed. And then the second and first semiconductor layers, 320 and 310, and the substrate 210 are etched through the patterned HM 330.

In the present embodiment, the etching depth is controlled such that the first and second semiconductor layers, 310 and 320 are fully exposed in the fin trench 430 adjacent first fins 410 and that the second semiconductor layer 320 is fully exposed in the fin trench 440 adjacent second fins 420.

Referring to FIGS. 1 and 7A-7B, the method 100 proceeds to step 114 by converting the first semiconductor material layer 310 to a dielectric layer 510 for device electric insulation enhancement. In some embodiments, the conversion process is an oxidation process. In one embodiment, the thermal oxidation process is conducted in oxygen ambient. In another embodiment, the thermal oxidation process is conducted in a combination of steam ambient and oxygen ambient. During the thermal oxidation process, at least side portions of the first semiconductor material layer 310 converts to dielectric layer 510.

As an example, the first semiconductor material layer 310 includes $SiGe_x$, here the subscript x is Ge composition in atomic percent. The first semiconductor material layer 310 is partially or completely oxidized by the thermal oxidation process, thereby forming semiconductor oxide layer 510 that includes silicon germanium oxide ($SiGeO_y$) or germanium oxide ($GeO_y$), where subscript y is oxygen composition in atomic percent.

In some embodiments, during the thermal oxidation process, the exposed second semiconductor material layer 320, in both of the first and second fins, 410 and 420, may also be partially oxidized to a semiconductor oxide layer 520 on the exposed surface thereof. In such a scenario, the thermal oxidation process is controlled such that the semiconductor material layer 320 oxidizes much slower than the first semiconductor material layers 310 does. As such, the second semiconductor oxide layer 520 is thinner than the first semiconductor oxide layer 510.

For example, in some embodiments the thermal oxidation process is performed in a $H_2O$ reaction gas with a temperature ranging from about 400° C. to about 600° C. and under a pressure ranging from about 1 atm. to about 20 atm. In some embodiment, after the oxidation process, the semiconductor oxide layer 550 is removed by a cleaning process including using diluted hydrofluoric (DHF) acid. In some embodiment, the semiconductor oxide layer 520 is not removed. For clarity, in subsequent drawings, the semiconductor oxide layer 520 will not be illustrated as it has been removed by a cleaning process.

Figure 8A:
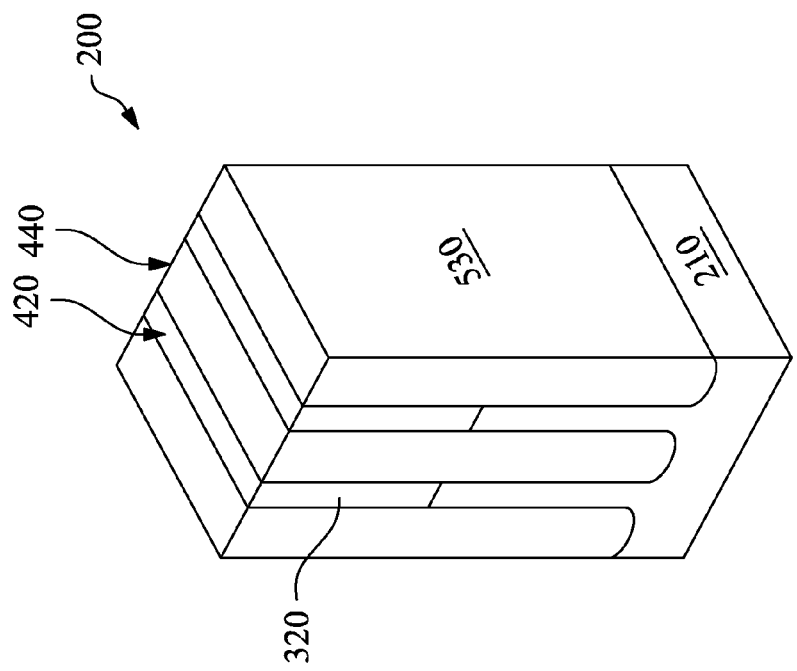
Figure 8B:
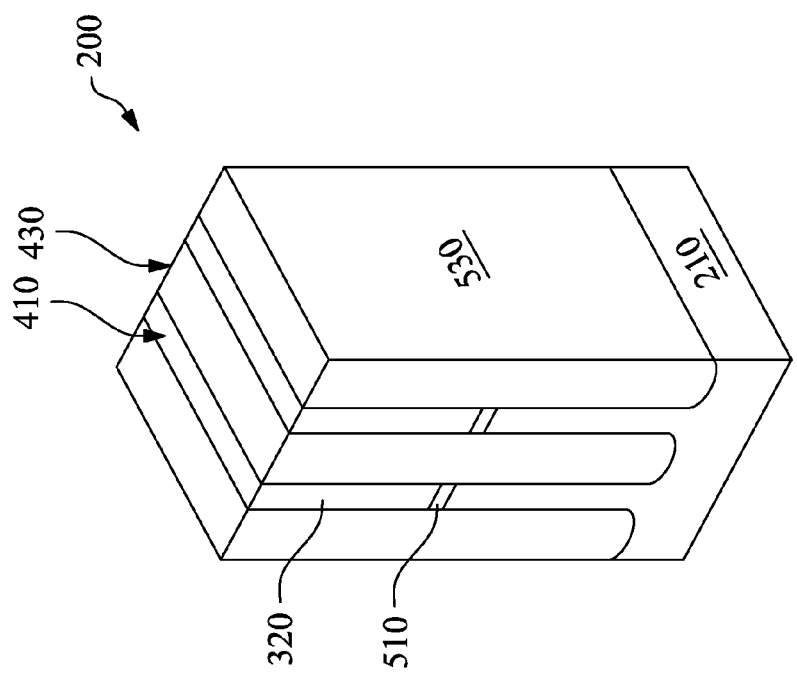

Referring to FIGS. 1 and 8A-8B, the method 100 proceeds to step 116 by filling the fin trenches 430 and 440 with a first dielectric layer 530 to separate first fins 310 from each other and separate second fins 320 from each other. The first dielectric layer 530 may include silicon oxide, silicon nitride, silicon oxynitride, an air gap, other suitable materials, or combinations thereof. The first dielectric layer 530 may be deposited by ALD, HDP-CVD, flowable CVD (FCVD) (e.g., a CVD-based material deposition in a remote plasma system and post curing to make it convert to another material, such as an oxide), the like, or a combination thereof. In the present embodiment, a planarization process, such as a chemical mechanical polish (CMP), is applied to remove any excess first dielectric layer 530, as well as the patterned blanket HM 330. After the CMP process is performed, top surfaces of the first dielectric layer 530 and top surfaces of the first and second fins, 410 and 420, are substantially coplanar.

Figure 9B:
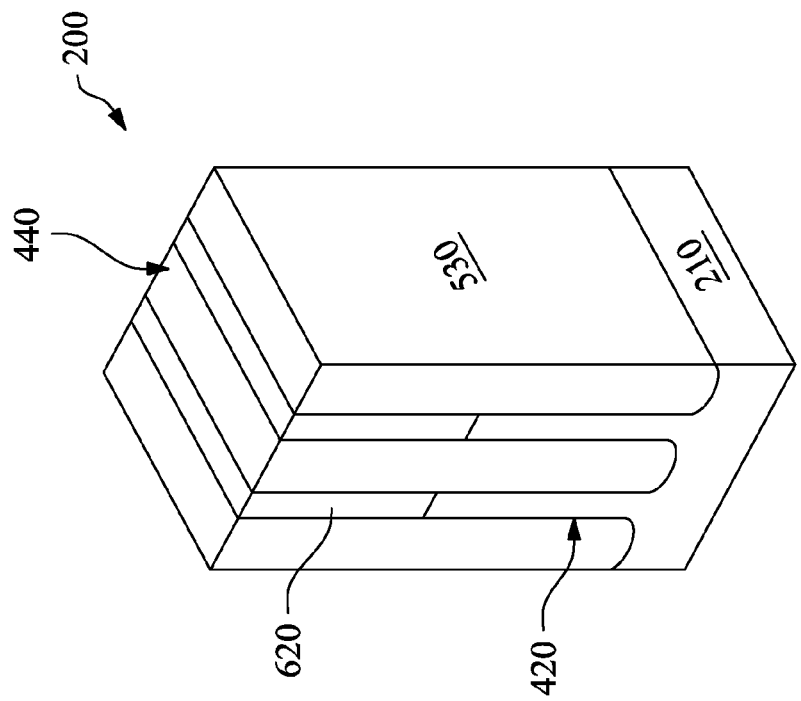
Figure 9A:
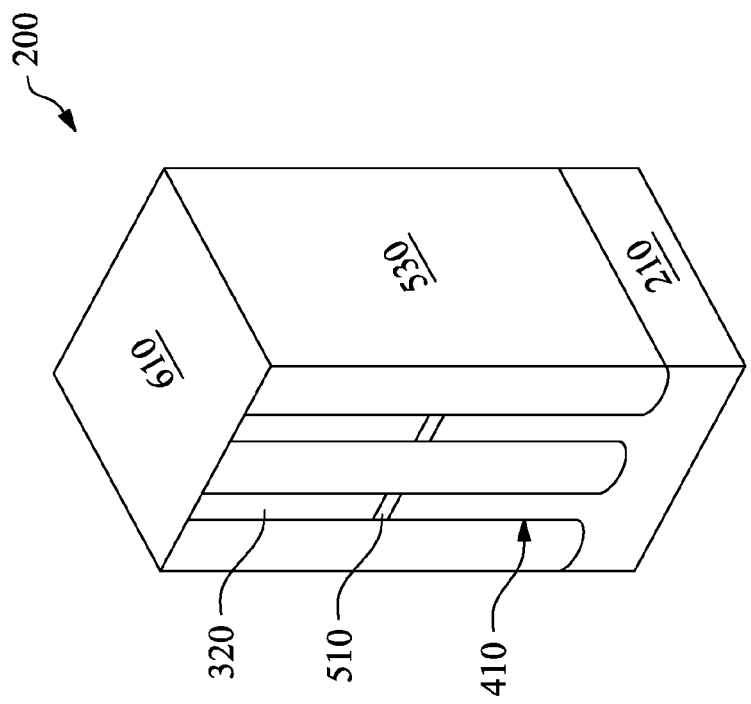

Referring to FIGS. 1 and 9A-9B, the method 100 proceeds to step 118 by recessing the second fins 420 and depositing a third semiconductor material layer 620 over the recessed second fins 420, while a second patterned HM 610 covers the NMOS region. The second patterned HM 610 is formed to protect predetermined regions, such as NMOS region. The second patterned HM 610 may include silicon nitride, silicon oxynitride, silicon carbide, silicon carbon nitride, the like, or a combination thereof. The second patterned HM 610 is formed similarly in many respects to the first patterned HM 212 discussed above in association with FIGS. 5A-5B.

The second fins 420 may be recessed by a selective dry etch, a selective wet etch, or combination thereof. The etching selectively recesses the second fin 420 without substantially etching the first dielectric layer 530.

The third semiconductor material layer 620 may include Ge, GaAs, AlGaAs, SiGe, GaAsP, and/or other suitable materials. The third semiconductor material layer 620 is formed similarly in many respects to the first semiconductor material layer 310 discussed above in association with FIGS. 3A-3B.

Figure 10B:
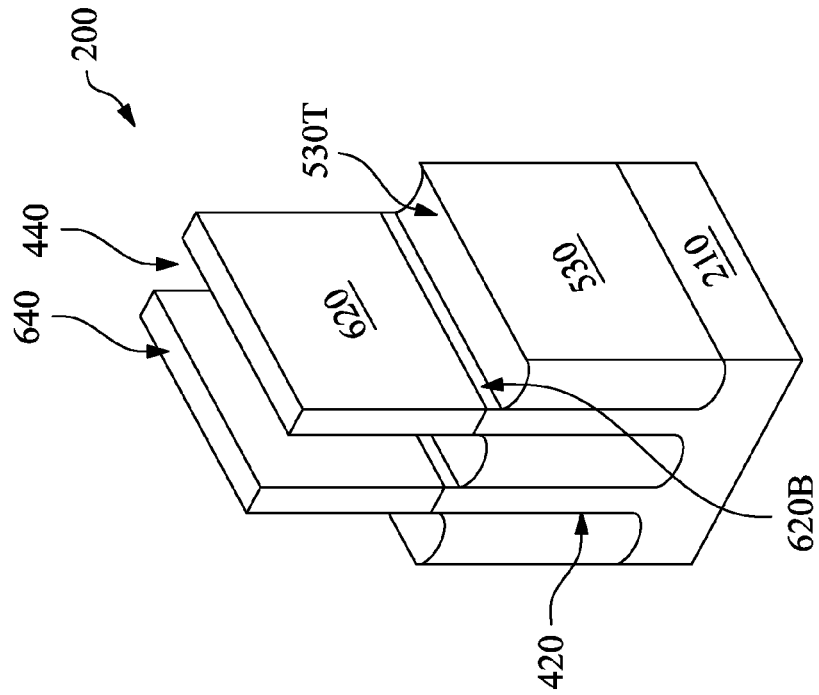
Figure 10A:
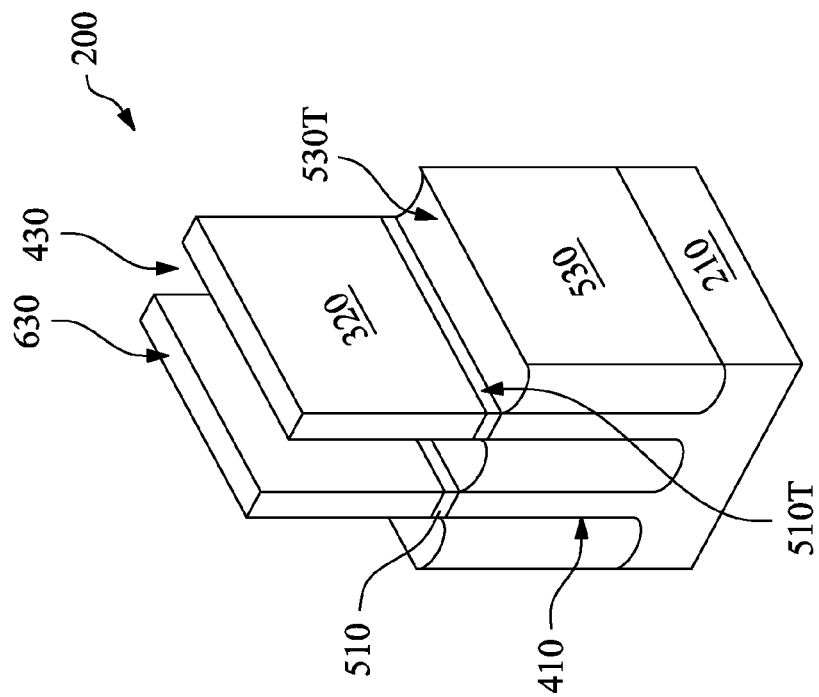

Referring to FIGS. 1 and 10A-10B, the method 100 proceeds to step 120 by recessing the first dielectric layer 530 around the second and third semiconductor material layers, 320 and 620, to laterally expose them. In the present embodiment, the etching depth is controlled in the NMOS region such that the second semiconductor material layer 320 is fully exposed and the dielectric layer 510 is, at least, partially exposed and in the PMOS the third semiconductor material 620 is fully exposed and substrate 210 is, at least, partially exposed. As shown, a top surface 530T of the recessed first dielectric layer 530 is below a top surface 510T of the semiconductor dielectric material layer 510 in the NMOS region and below the bottom surface 620B of the third semiconductor material layer 620 in the PMOS region.

In some embodiments, the first dielectric layer 530 is recessed by a selective dry etch, a selective wet etch, or combination thereof. The etching selectively recesses the first dielectric layer 530 without substantially etching the second and third semiconductor material layers, 320 and 620.

For the sake of clarity and to better illustrate the concepts of the present disclosure, the exposed second semiconductor material layer 320 is referred to as a third fin 630 and the exposed third semiconductor material layer 620 is referred to as a fourth fin 640. Thus the third fin 630 is formed over and in physical contact with the dielectric layer 510 of the first fin 410 and the fourth fin 640 is formed over and in physical contact with the second fin 420. As discussed above, the dielectric layer 510 provides an electric insulation enhancement for the third fins 630.

Figure 11B:
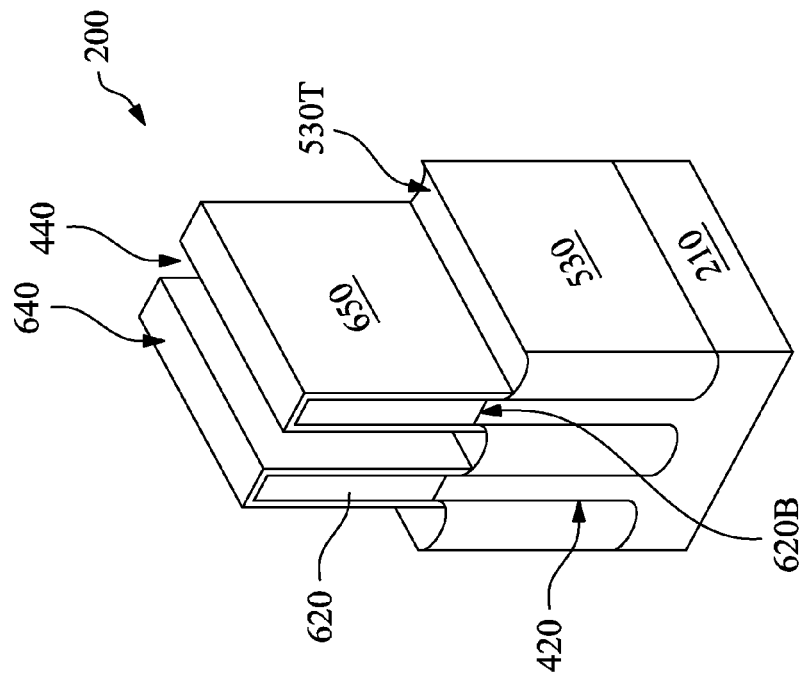
Figure 11A:
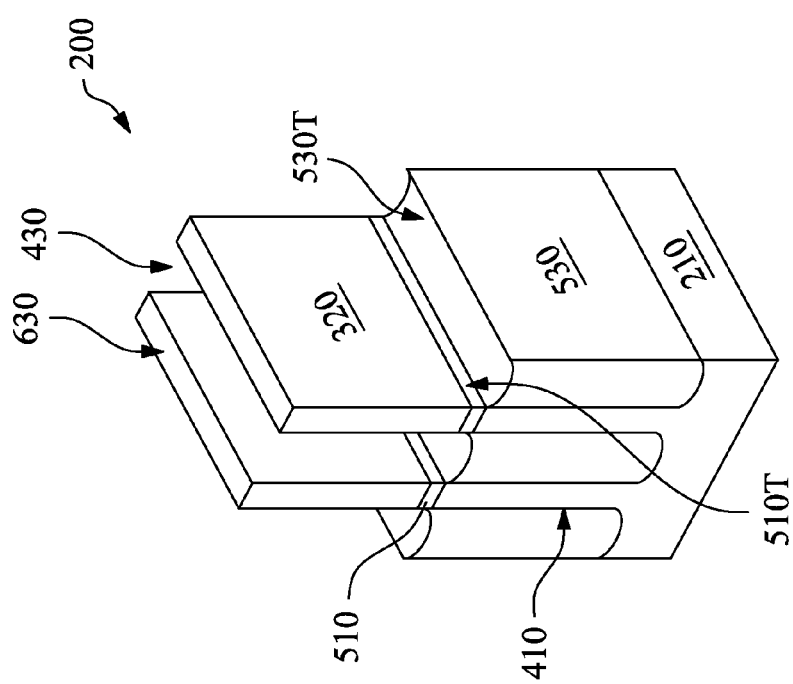

Referring to FIGS. 1 and 11A-11B, the method 100 proceeds to step 122 by forming a first capping layer 650 over the fourth fins 640 to prevent out-diffusion. In one embodiment, the first capping layer 650 includes Si to prevent out-diffusion of Ge from the SiGe fin 640 (the fourth fin). In some embodiments, first, the first capping layer 650 is deposited over the substrate 210 by ALD, CVD, PVD, or other proper techniques. Then a patterned HM is formed to cover the first capping layer 650 over the fourth fins 640. The first capping layer is then etched through the patterned HM. The first capping layer 650 is removed by a selective etch. The patterned HM is removed by another etching process.

Figure 12A:
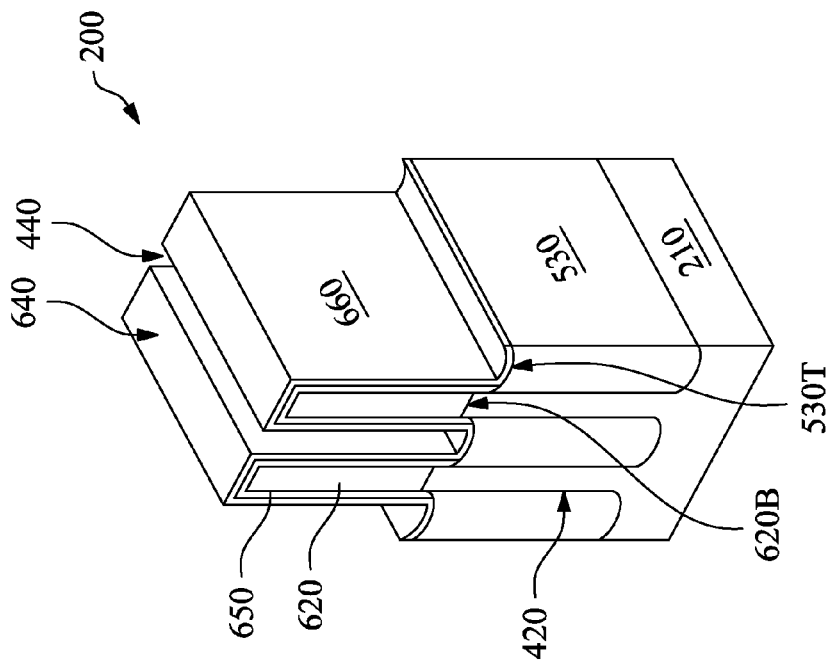
Figure 12B:
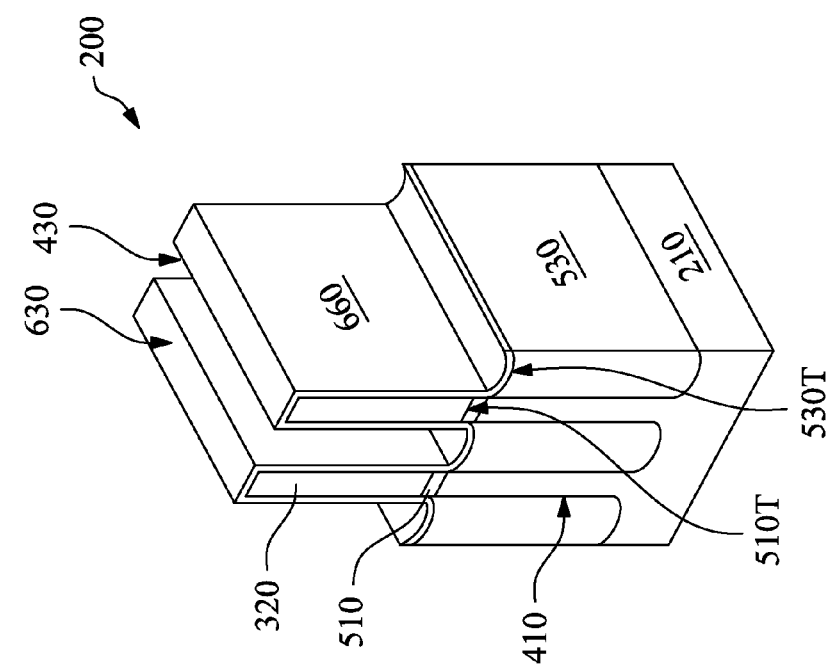

Referring to FIGS. 1 and 12A-12B, the method 100 proceeds to step 124 by forming a second capping layer 660 over the third fins 630 and the fourth fins 640. As shown, the second capping layer 660 is disposed directly on second semiconductor material layer 320, dielectric layer 510, and first dielectric layer 530 in the NMOS region and the second capping layer 660 is disposed directly on first capping layer 650, second fins 420, and first dielectric layer 530 in the PMOS region. The second capping layer 660 may include silicon nitride, silicon oxynitride, silicon carbide, silicon carbon nitride, or other proper material. In the present embodiment, the second capping layer 660 is different from the first dielectric layer 530 to achieve etching selectivity during a subsequent etch, which will be described later. In one embodiment, the second capping layer 660 includes silicon nitride. The second capping layer 660 may be deposited by ALD, CVD, PVD, or other proper techniques.

Figure 13A:
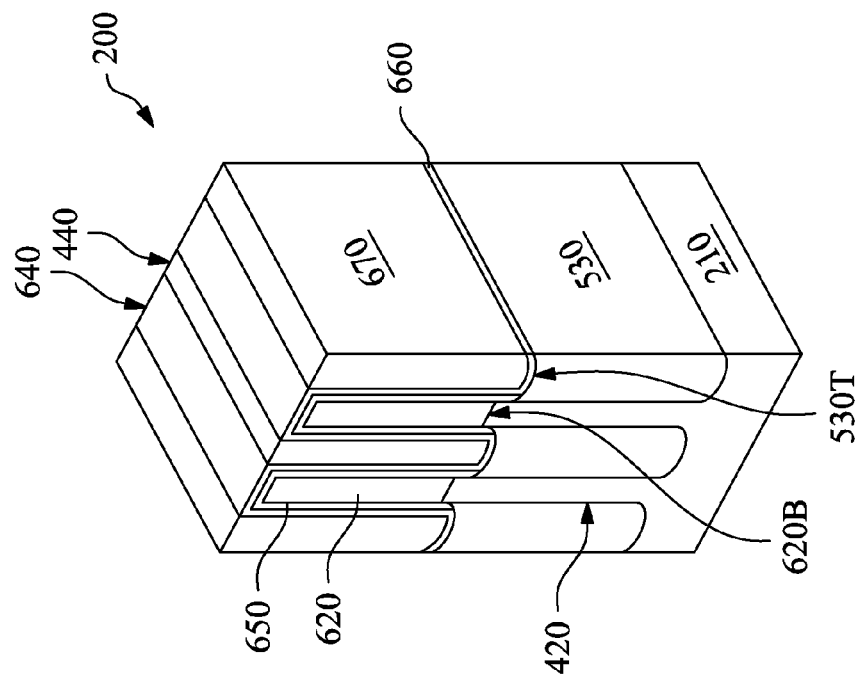
Figure 13B:
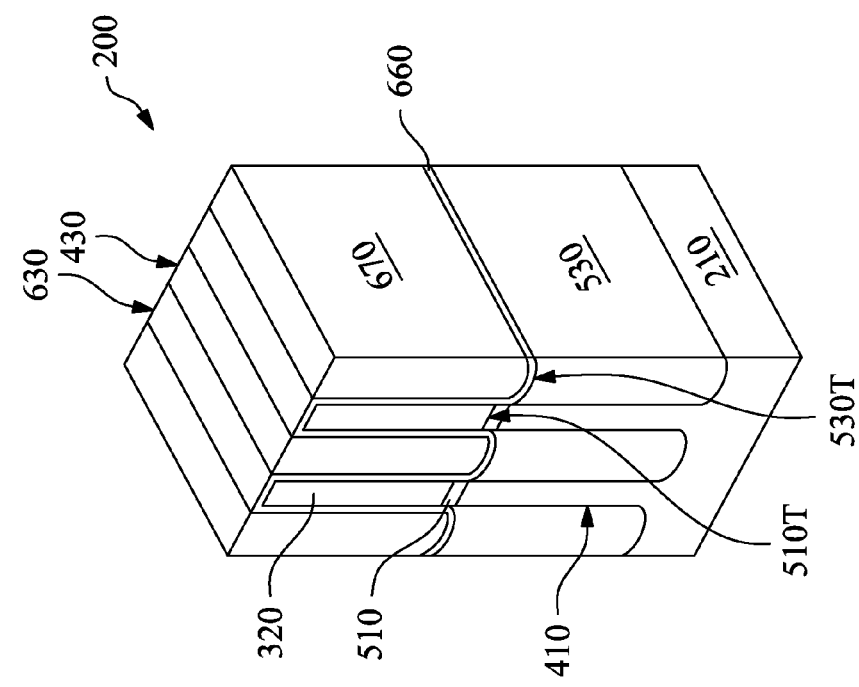

Referring to FIGS. 1 and 13A-13B, the method 100 proceeds to step 126 by forming a second dielectric layer 670 over the second capping layer 660. The second dielectric layer 670 is similar in many respects to the first dielectric layer 530 discussed above in association with FIGS. 8A-8B. In one embodiment, the second dielectric layer 670 has same material as the first dielectric layer 530. During formation of the second dielectric layer 670, the second capping layer 660 protects the third and fourth fins, 630 and 640 to prevent adverse impacts, such as a further oxidation during an anneal process performed after forming the second dielectric layer 670 by a FCVD process.

In the present embodiment, a planarization process, such as a CMP, is applied to remove any excess second dielectric layer 670 and planarize top surface of the second dielectric layer 670 with respect to the top surface of the third and fourth fins, 630 and 640. In some embodiments, the second capping layer 660 serves as an etching-stop layer in the CMP process to improve recessing process window.

Figure 14A:
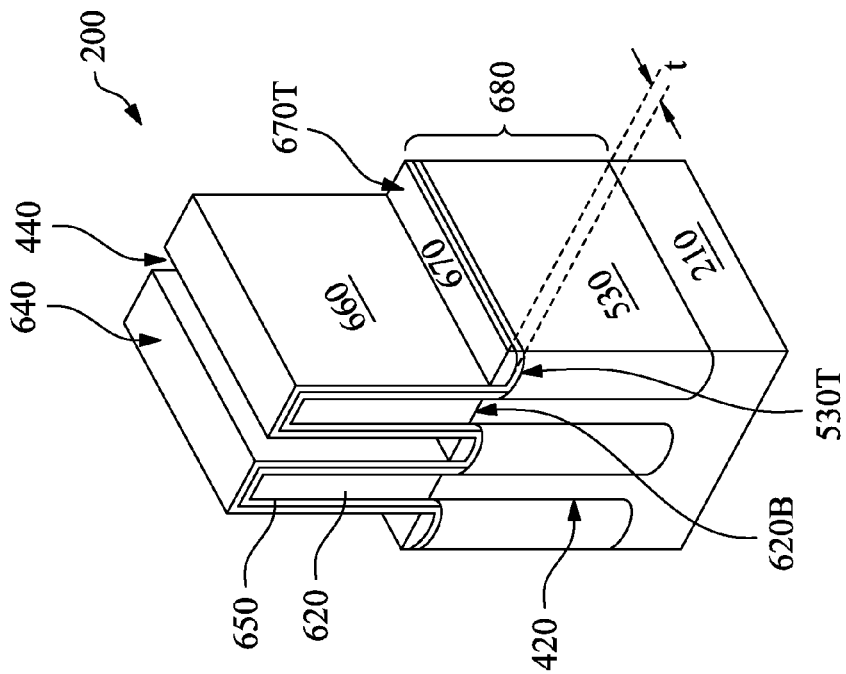
Figure 14B:
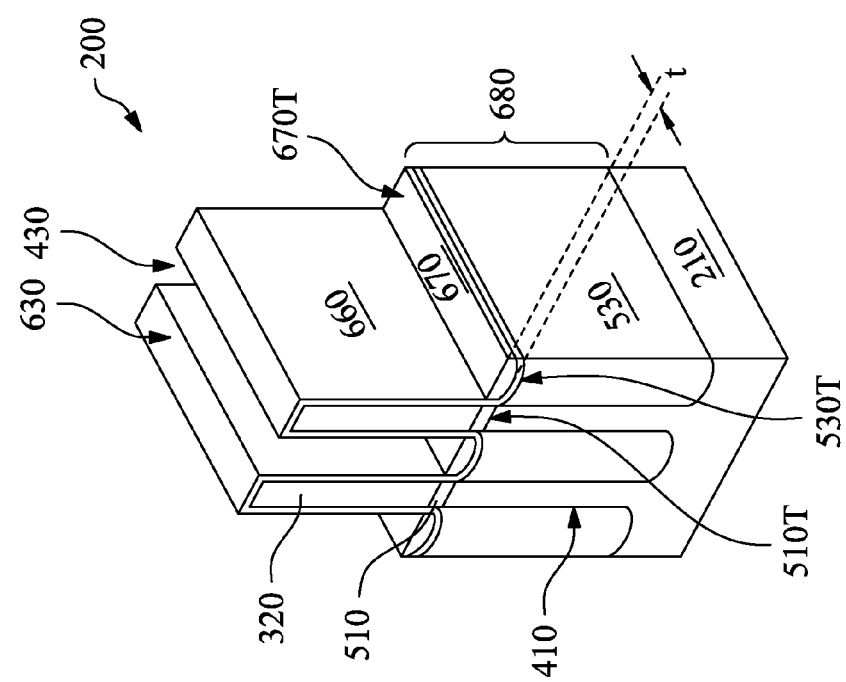

Referring to FIGS. 1 and 14A-14B, the method 100 proceeds to step 128 by recessing the second dielectric layer 670 to lateral expose the second capping layer 660 over the third and fourth fins, 630 and 640. The recessing is controlled such that a top surface 670T of the second dielectric layer 670 remains a thickness t above the second capping layer 660 in fin trenches 430 and 440, respectively. Thus, the recessed first dielectric layer 530, the remaining second dielectric layer 670, and second capping layer 660 form isolation features 680 (or referred to as shallow trench isolation (STI) features) between each of the first fins 410, the second fins 420, the third fins 630 and the fourth fins 640. By controlling the remaining thickness t of the second dielectric layer 670, the method provides process flexibilities and the feasibility to achieve a targeted thickness of the STI feature 680.

The second dielectric layer 670 may be recessed by a selective dry etch, a selective wet etch, or combination thereof. The etching selectively recesses the second dielectric layer 670 without substantially etching the second capping layer 660. Therefore, the second capping layer 660 protects the third and fourth fins, 630 and 640 to avoid adverse impacts on the third and fourth fins during the recessing process, such as fin height loss.

Figure 15B:
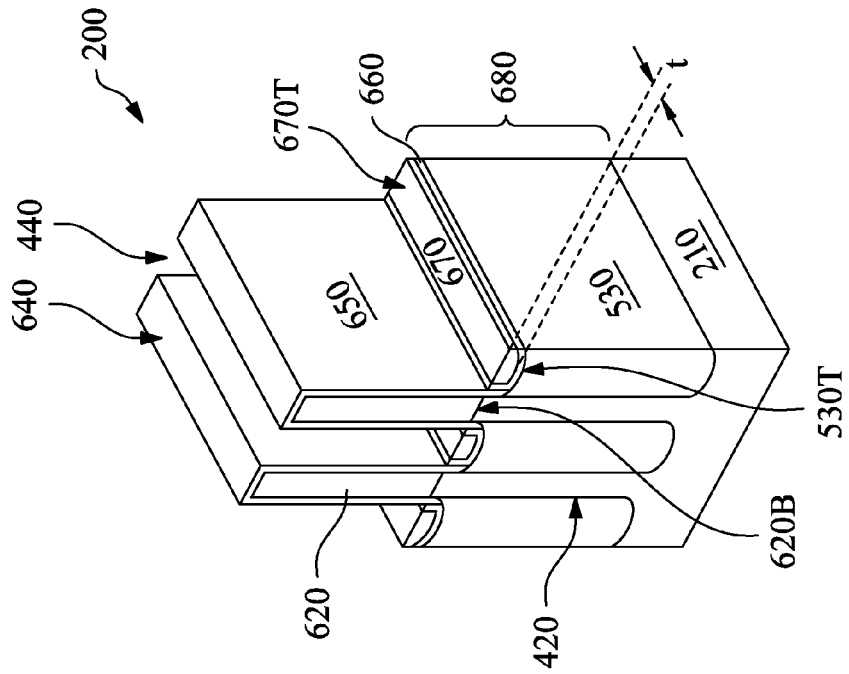
Figure 15A:
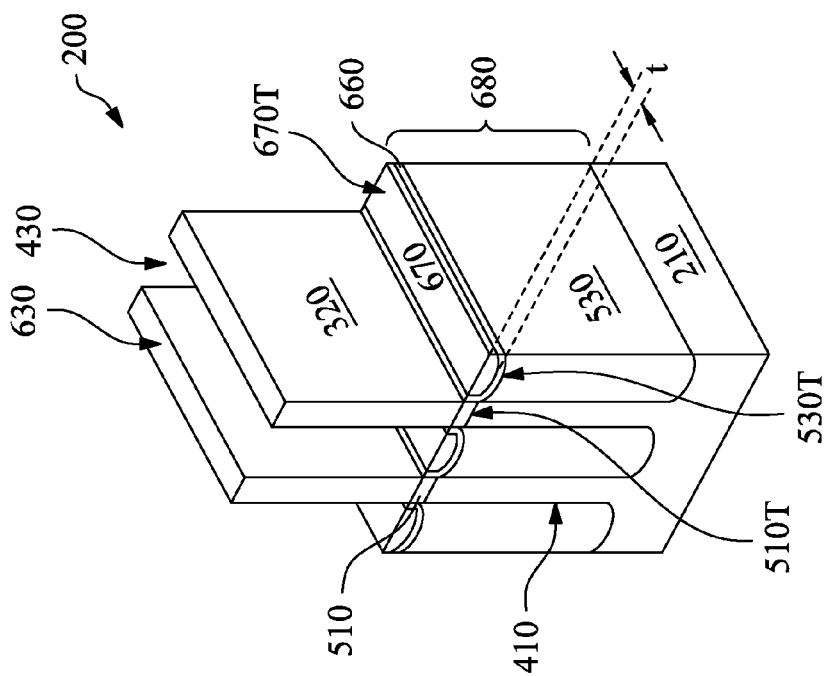

Referring to FIGS. 1 and 15A-15B, the method 100 proceeds to step 130 by removing a portion of the second capping layer 660 from the third and fourth fins, 630 and 640. In the present embodiment, the second capping layer 660 may be removed by a selective dry etch, a selective wet etch, or combination thereof. The etching selectively removes the second capping layer 660 without substantially etching the second dielectric layer 670, the second semiconductor material layer 320 and the first capping layer 650. Therefore, the second capping layer 660 underneath the second dielectric layer 670 in the fin trenches, 430 and 440, remains intact.

Figures 16A, 16B:
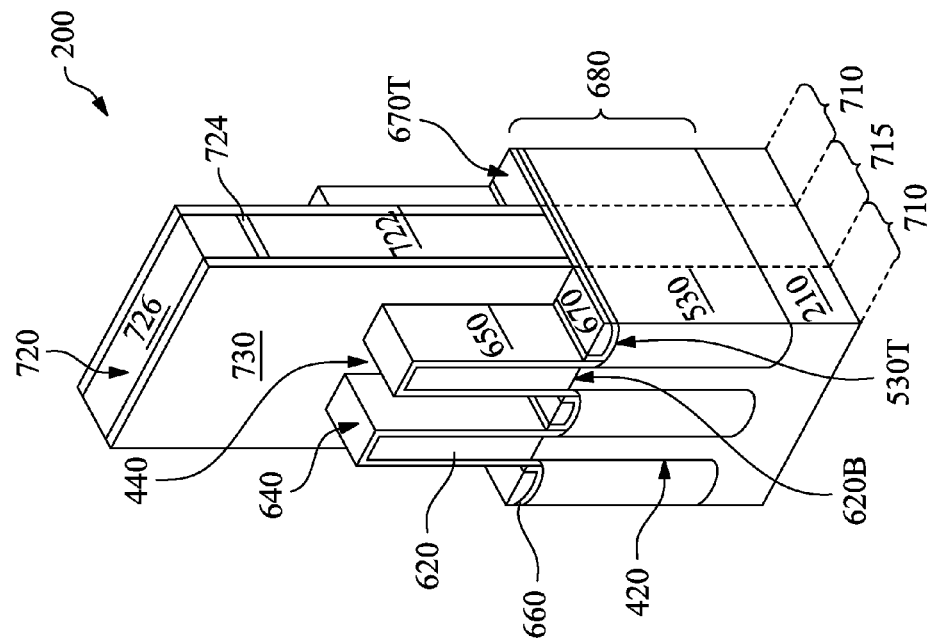

Referring to FIGS. 16A-16B, in some embodiments, the third and fourth fins, 630 and 640, each includes source/drain (S/D) regions 710 and a gate region 715. In furtherance of the embodiment, one of the S/D regions 710 is a source region, and another of the S/D regions 710 is a drain region. The S/D regions 710 are separated by the gate region 715.

Referring again to FIGS. 1 and 16A-16B, the method 100 proceeds to step 132 by forming a gate stack 720 and sidewall spacers 730 on sidewalls of the gate stack 720 in the gate region 715. In one embodiment using a gate-last process, the gate stack 720 is a dummy gate and will be replaced by the final gate stack at a subsequent stage. Particularly, the dummy gate stacks 720 are to be replaced later by a high-k dielectric layer (HK) and metal gate electrode (MG) after high thermal temperature processes, such as thermal annealing for source/drain activation during the sources/drains formation.

The dummy gate stack 720 is formed over the substrate 210, including wrapping over portions of the third and fourth fins, 630 and 640. In one embodiment, the dummy gate stack 720 includes an electrode layer 722, a silicon oxide layer 724 and a gate HM 726. The electrode layer 722 may include polycrystalline silicon (polysilicon). The gate HM 726 includes a suitable dielectric material, such as silicon nitride, silicon oxynitride or silicon carbide. The dummy gate stack 720 is formed by a suitable procedure including deposition, lithography patterning and etching. In various examples, the deposition includes CVD, PVD, ALD, thermal oxidation, other suitable techniques, or a combination thereof. The etching process may include dry etching, wet etching, and/or other etching methods (e.g., reactive ion etching).

The sidewall spacers 730 may include a dielectric material such as silicon oxide, silicon nitride, silicon carbide, silicon oxynitride, or combinations thereof. The sidewall spacers 730 may include a multiple layers. Typical formation methods for the sidewall spacers 730 include depositing a dielectric material over the gate stack 720 and then anisotropically etching back the dielectric material. The etching back process may include a multiple-step etching to gain etch selectivity, flexibility and desired overetch control.

Figure 17A:
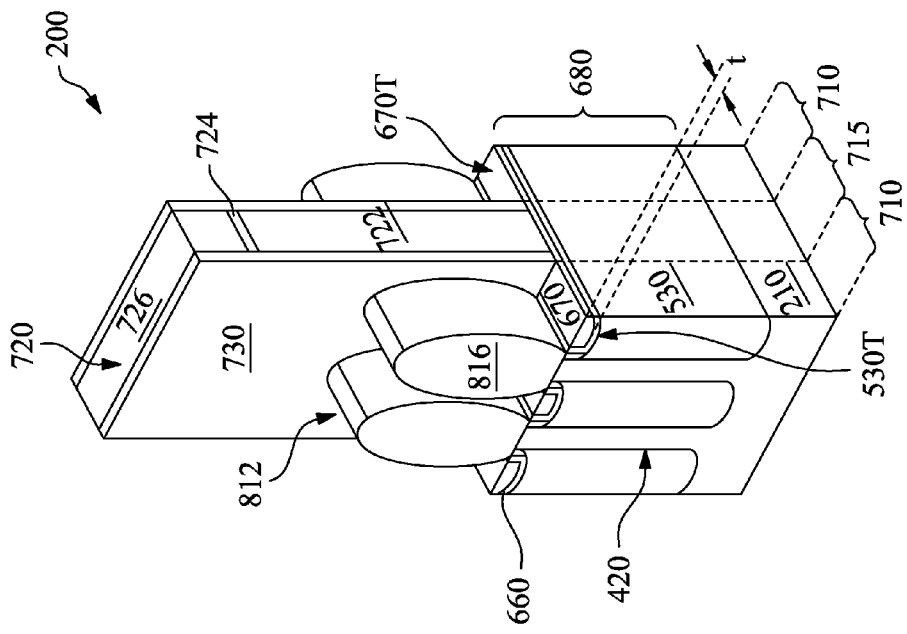
Figure 17B:
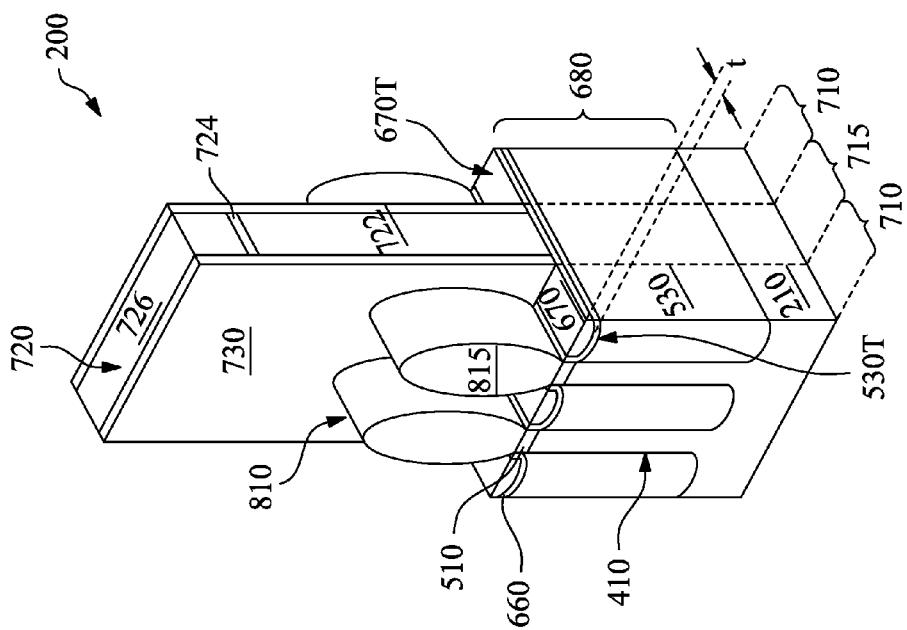

Referring to FIGS. 1 and 17A-17B, the method 100 proceeds to step 134 by forming first S/D features 810 in the S/D regions 710 of the NMOS region and second S/D feature 812 in the S/D region 710 of the PMOS region. The S/D features, 810 and 812, may be formed by recessing a portion of the third and fourth fins, 630 and 640, in the S/D regions 710 to form S/D recessing trenches and epitaxially growing a fourth and fifth semiconductor material layers, 815 and 816, in the S/D recessing trenches. The fourth and fifth semiconductor material layers, 815 and 816, may include Ge, Si, GaAs, AlGaAs, SiGe, GaAsP, and/or other suitable material. The first and second S/D features, 810 and 812, may be formed by one or more epitaxy or epitaxial (epi) processes. The first and second S/D features, 810 and 812, may be in-situ doped during the epi process. For example, the epitaxially grown Si epi first S/D feature 810 may be doped with carbon to form Si:C S/D features, phosphorous to form Si:P S/D features, or both carbon and phosphorous to form SiCP S/D features; the epitaxially grown SiGe second S/D features 812 may be doped with boron. In one embodiment, the first and second S/D features, 810 and 812, are not in-situ doped, an implantation process (i.e., a junction implant process) is performed to dope the first and second S/D features, 810 and 812.

Figure 18B:
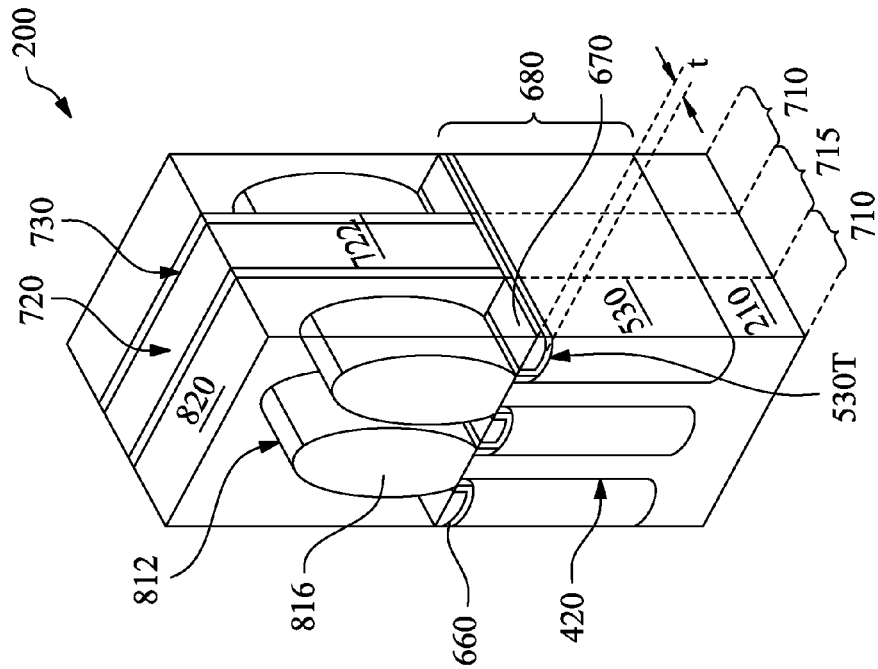
Figure 18A:
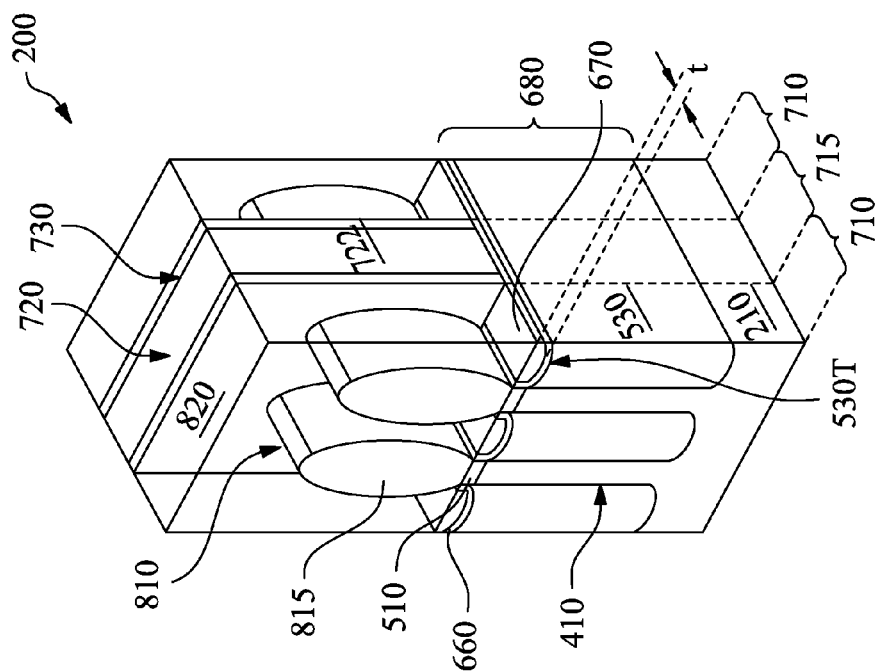

Referring to FIGS. 1 and 18A-18B, the method 100 proceeds to step 136 by forming an interlayer dielectric (ILD) layer 820 over the substrate 210. The ILD layer 820 includes silicon oxide, silicon oxynitride, low k dielectric material and/or other suitable dielectric materials. The ILD layer 820 may include a single layer or alternative multiple layers. The ILD layer 820 is formed by a suitable technique, such as CVD, ALD and spin-on (SOG). A CMP process may be performed thereafter to remove excessive ILD layer 820, as well as the third HM 726 and the pad oxide layer 724, to planarize the top surface of the semiconductor device 200.

Figure 19A:
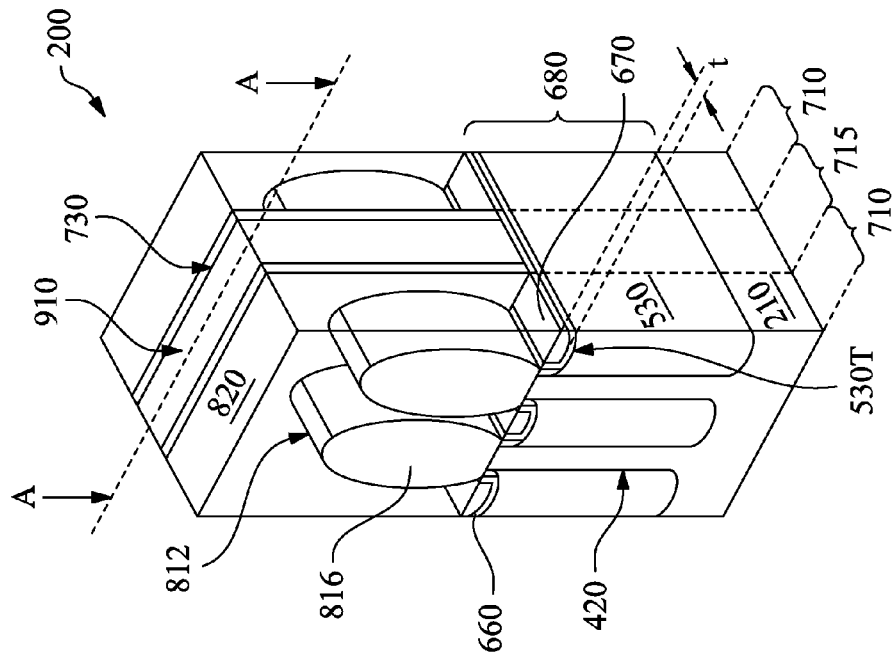
Figure 19B:
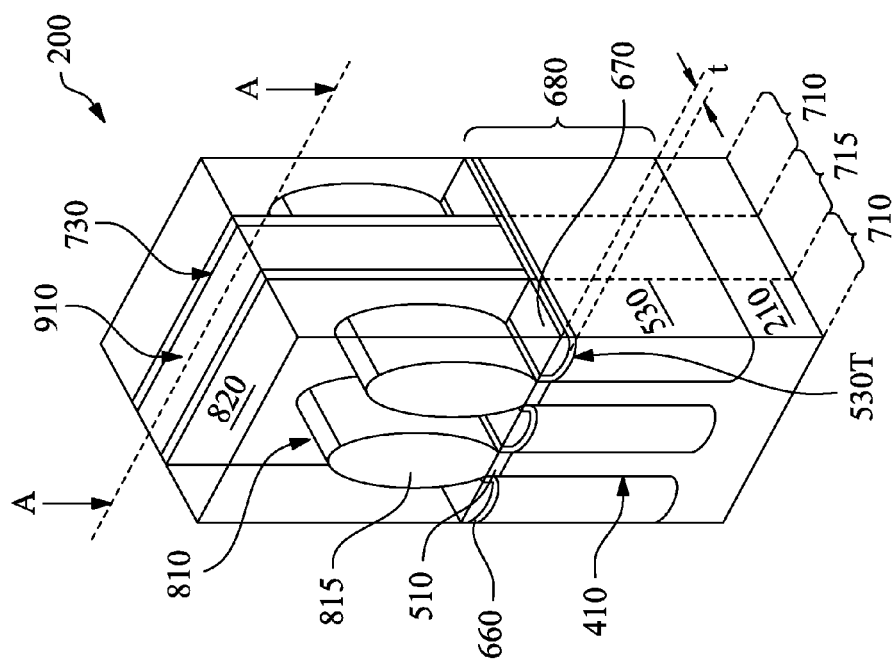

Referring to FIGS. 1 and 19A-19B, the method 100 proceeds to step 140 by replacing the dummy gate stacks 720 with metal gate stacks (MG) 910. The dummy gate stacks 720 are first removed to form gate trenches. The dummy gate stack 720 may be removed by an etch process (such as selective wet etch and/or selective dry etch) designed to have an adequate etch selectivity with respect to the sidewall spacers 730, the ILD layer 820, the second and third semiconductor material layers, 320 and 630. The etch process may include one or more etch steps with respective etchants. Alternatively, the dummy gate stack 720 may be removed by a series of processes including photolithography patterning and etching process.

The MG stack 910 is then formed in the gate trenches, including wrapping over the third fins 630 and the fourth fins 640. The MG stack 910 may include gate dielectric layer and gate electrode over the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the MG stack 910 may include depositions to form various gate materials and a CMP process to remove the excessive gate materials and planarize the top surface of the semiconductor device 200.

Figures 20A, 20B:
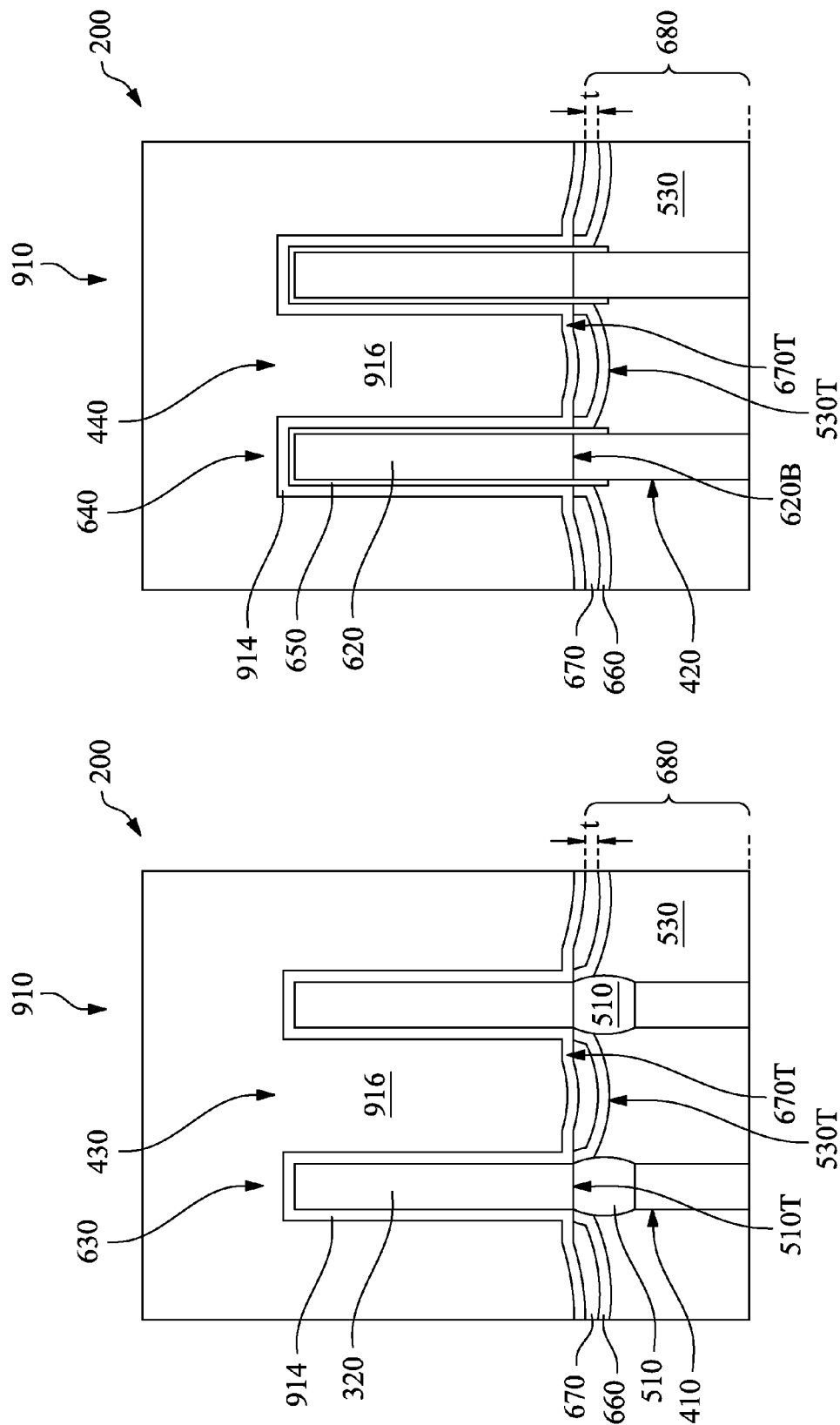
FIGS. 20A and 21A are cross-sectional views of an example device in accordance with some embodiments, along the line A-A in FIG. 19A.
FIG. 20B is a cross-sectional views of an example device in accordance with some embodiments, along the line A-A in FIG. 19B.

The semiconductor device 200 is further illustrated in FIGS. 20A and 20B, in a sectional fragmental view. Particularly, a portion of the semiconductor device 200 is zoomed in for clarity. In embodiment, the gate dielectric layer 914 includes an interfacial layer (IL) and a HK dielectric layer. The IL includes oxide, HfSiO and oxynitride, deposited by a suitable method, such as ALD, CVD, thermal oxidation or ozone oxidation. The HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

A metal gate (MG) electrode 916 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. The MG electrode 916 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 916 may be formed by ALD, PVD, CVD, or other suitable process. The MG electrode 916 may be formed separately for the NMOS and PMOS with different metal layers. A CMP process may be performed to remove excessive MG electrode 916.

Referring again to FIGS. 19A and 20A, in the NMOS region, the third fin 630 is formed by the second semiconductor material layer 320 in the gate region 715. The third fin 630 is disposed over and in physical contact with the dielectric layer 510. The lower portion of the first fins 410 includes a portion of the substrate 210. The third fin 630 is wrapped by the MG stack 910. The STI feature 680 is formed between each of two first fins 410. The STI feature 680 includes the first dielectric layer 530, the second capping layer 660 disposed over and in physical contact with the first dielectric layer 530 and the second dielectric layer 670 disposed over and in physical contact with the second capping layer 660. The second dielectric layer 670 has thickness t. The top surface 530T of the first dielectric layer 530 is below the top surface 510T of the dielectric layer 510.

Referring again to FIGS. 19B and 20B, in the PMOS region, fourth fin 640 is formed by the third semiconductor material layer 620 in the gate region 715. The fourth fin 640 is deposited over and in physical contact with the second fin 420, which includes a portion of the substrate 210. The fourth fin 640 is wrapped by the MG stack 910. The STI feature 680 is formed between each of two second fins 420. The STI feature 680 includes the first dielectric layer 530, the second capping layer 660 deposited over and in physical contact with the first dielectric layer 530 and the second dielectric layer 670 deposited over and in physical contact with the second capping layer 660. The second dielectric layer 670 has thickness t. The top surface 530T of the first dielectric layer 530 is below the bottom surface 620B of the dielectric layer 510.

The semiconductor device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFETs. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional steps may be implemented before, during, and after the method 100, and some steps described above may be replaced or eliminated for other embodiments of the method.

Figure 21A:
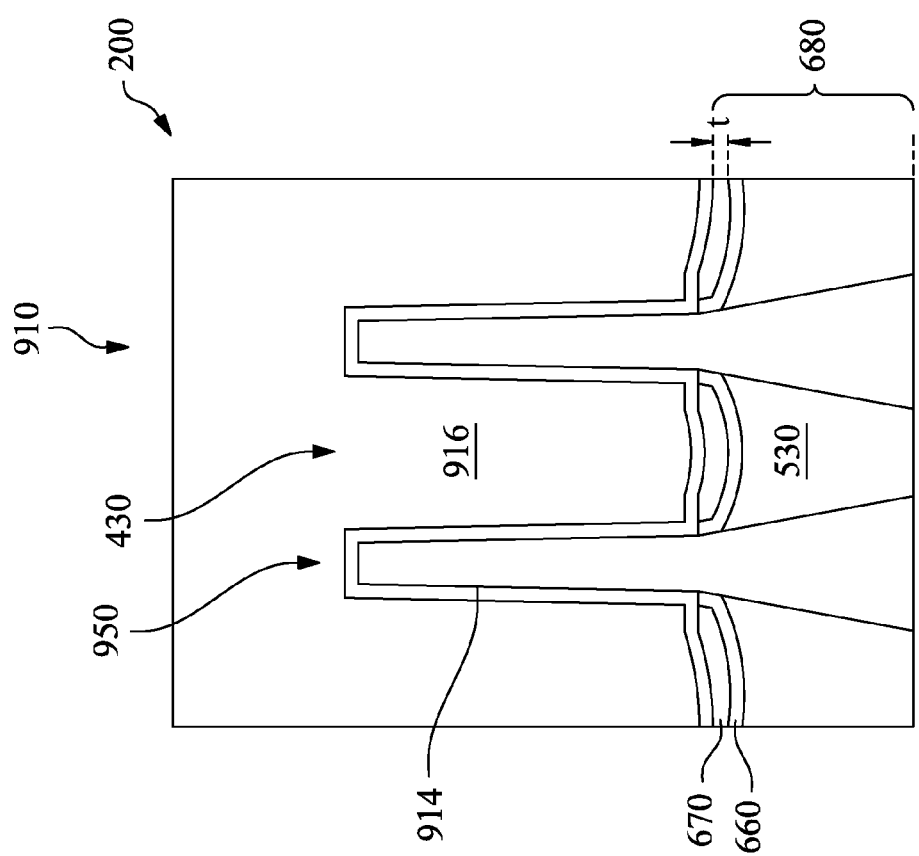

As an example, in one embodiment, steps of 104, 106, 108 and 114, for forming the dielectric layer 510, are eliminated. Thus, in the NMOS region, fifth fins 950 are formed including a portion of the substrate 210, as shown in FIG. 21A. The fifth fin 950 is wrapped by the MG stack 910. The STI feature 680 is formed between each of two fifth fins 950. The STI feature 680 includes the first dielectric layer 530, the second capping layer 660 deposited over and in physical contact with the first dielectric layer 530 and the second dielectric layer 670 deposited over and in physical contact with the second capping layer 660. The second dielectric layer 670 has thickness t.

Based on the above, the present disclosure offers a method for fabricating a semiconductor device. The method employs a capping layer to prevent adverse impacts on fin structures during forming isolation regions between fin structures. The method also employs forming a dielectric layer over the capping layer to achieve a targeted thickness of the isolation region. The method provides a quite simple and flexible process flow for formations of fin structures and isolation region. The method demonstrates device performance and reliability improvements.

Thus, the present disclosure provides one embodiment of a method fabricating a semiconductor structure. The method includes forming a first fin structure and a second fin structure over a substrate, which has a first trench positioned between the first and second fin structures. The method also includes forming a first dielectric layer within the first trench, recessing the first dielectric layer to expose a portion of the first fin structure, forming a first capping layer over the exposed portion of the first fin structure and the recessed first dielectric layer in the first trench, forming a second dielectric layer over the first capping layer in the first trench while the first capping layer covers the exposed portion of the first fin feature and removing the first capping layer from the first fin structure.

The present disclosure also provides another embodiment of a method fabricating a semiconductor structure. The method includes providing a substrate having a first region and a second region, forming a first fin structure and a second fin structure in the first region, which has a first trench positioned between the first and second fin structures. The method also includes forming a third fin structure and a fourth fin structure in the second region, which has a second trench positioned between the third and fourth fin structures. The third fin structure has a different material than the first fin structure. The method also includes forming a first dielectric layer in the first and second trenches, recessing the first dielectric layer in the first trench to expose a portion of the first and second fin structures and recessing the first dielectric layer in the second trench to expose a portion of the third and fourth fin structures. The method also includes forming a first capping layer over the third and fourth fin structures, forming a second capping layer over the first structure, the second fin structures, the first capping layer, the first and second trenches. The method also includes forming a second dielectric layer over the second capping layer in the first and second trenches; and removing the second capping layer from the first fin structure, the second fin structure and the first capping layer.

The present disclosure also provides a structure of a device. The device includes a first fin structure in a first region of the substrate, which a first portion of the substrate, a dielectric layer deposited over and in physical contact with the first portion of the substrate, a first semiconductor material layer deposited over and in physical contact with the dielectric layer. The device also includes a second fin structure in a second region of the substrate, which has a second portion of the substrate, a second semiconductor material layer disposed over and in physical contact with the second portion of the substrate and a first capping layer wrapping over the second semiconductor material layer. The device also includes a first isolation structure disposed in the substrate adjacent the first fin structure, which has a first dielectric layer, a second capping layer disposed over and in physical contact with the first dielectric layer, the second capping layer physically contacting the dielectric layer and a second dielectric layer disposed over and in physical contact with the second capping layer. The device also includes a second isolation structure disposed in the substrate adjacent the second fin structure, which has the first dielectric layer, the second capping layer disposed over and in physical contact with the first dielectric layer, the second capping layer physically contacting the first capping layer and the second dielectric layer disposed over and in physical contact with the second capping layer. The device also includes a first metal gate wrapping over a portion of the first fin structure and a second metal gate wrapping over a portion of the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first fin structure and a second fin structure over a substrate, wherein a first trench is positioned between the first and second fin structures, wherein forming the first fin structure and the second fin structure over the substrate includes:
        epitaxially growing a first semiconductor material layer over the substrate;
        epitaxially growing a second semiconductor material layer on top of the first semiconductor material layer;
        etching the second and first semiconductor material layers to form the first fin structure, the second fin structure and the first trenches; and
        converting the first semiconductor material layer to a dielectric layer;
    forming a first dielectric layer within the first trench;
    recessing the first dielectric layer to expose a portion of the first fin structure;
    forming a first capping layer over the exposed portion of the first fin structure and the recessed first dielectric layer in the first trench, wherein a portion of the first capping layer extends from the first fin structure to the second fin structure;
    forming a second dielectric layer over the first capping layer in the first trench while the first capping layer covers the exposed portion of the first fin structure and the portion of the first capping layer extends from the first fin structure to the second fin structure; and
    removing the first capping layer from the first fin structure.

2. The method of claim 1, wherein forming the first fin structure and the second fin structure over the substrate, includes:
    forming a patterned mask over the substrate; and
    removing a portion of the substrate through the patterned mask to form first and second fin structures and the first trenches.

3. The method of claim 1, wherein the first dielectric layer is recessed to fully expose the second semiconductor material layer and partially expose the dielectric layer.

4. The method of claim 1, wherein forming the second dielectric layer over the first capping layer in the trench while the first capping layer covers the exposed portion of the first fin feature, includes:
    depositing the second dielectric layer over the first capping layer over the first trench, the first fin structures and the second fin structure; and
    recessing the second dielectric layer by a selective etch process, which recesses the second dielectric layer but does not substantially etch the first capping layer.

5. The method of claim 1, further comprising:
    forming a third fin structure and a fourth fin structure over the substrate, wherein a second trench is positioned between the third and fourth fin structures, wherein the second trench is filled with recessed first dielectric layer;
    forming a fin capping layer over the third fin structure;
    forming the first capping layer over the fin capping layer and the recessed first dielectric layer in the second trench;
    forming the second dielectric layer over the first capping layer in the second trench while the first capping layer covers third fin structure; and
    removing the first capping layer.

6. The method of claim 5, wherein forming the third fin structure and the fourth fin structure over the substrate includes:
    etching the substrate to form a fin feature and the second trench;
    filling in the second trench with the first dielectric layer;
    removing a portion the fin feature to form a fin trench;
    epitaxially growing a third semiconductor material layer in the fin trench; and
    recessing the firs dielectric layer to fully exposed the third semiconductor material layer.

7. The method of claim 1, further comprising:
    after removing the first capping layer, forming dummy gates in a gate region in the first fin structure;
    forming a source/drain (S/D) features in a S/D region in the first fin structure; and
    replacing the dummy gates with a high-k/metal gate (HK/MG) wrapping over the first fin structure.

8. A method, comprising:
    providing a substrate having a first region and a second region;
    forming a first fin structure and a second fin structure in the first region, wherein a first trench is positioned between the first and second fin structures;
    forming a third fin structure and a fourth fin structure in the second region, wherein a second trench is positioned between the third and fourth fin structures, wherein the third fin structure has a different material than the first fin structure;
    forming a first dielectric layer in the first and second trenches;
    recessing the first dielectric layer in the first trench to expose a portion of the first and second fin structures and recessing the first dielectric layer in the second trench to expose a portion of the third and fourth fin structures;
    forming a first capping layer over the third and fourth fin structures;
    forming a second capping layer over the first fin structure, the second fin structure, the first capping layer, the first and second trenches;
    forming a second dielectric layer over the second capping layer in the first and second trenches; and removing the second capping layer from the first fin structure, the second fin structure and the first capping layer.

9. The method of claim 8, wherein forming the first fin structure and the second fin structure in the first region includes:
- epitaxially growing a first semiconductor material layer over the substrate;
- epitaxially growing the second semiconductor material layer on top of the first semiconductor material layer; and
- etching the second and first semiconductor material layers to form the first fin structure, the second fin structure and the first trenches; and
- converting the first semiconductor material layer to the dielectric layer.

10. The method of claim 9, wherein recessing the first dielectric layer in the first trench to expose the portion of the first and second fin includes recessing the first dielectric layer to fully expose the second semiconductor material layer and partial of the dielectric layer.

11. The method of claim 8, wherein forming the first fin structure and the second fin structure in the first region includes:
- forming a patterned mask over the substrate; and
- removing a portion of the substrate through the patterned mask to form first fin structure, the second fin structure and the first trenches.

12. The method of claim 8, wherein forming the third fin structure and the fourth fin structure in the second region, includes:
- etching the substrate to form a fin feature and the second trench;
- filling in the second trench with the first dielectric layer;
- removing a portion the fin feature to form a fin trench;
- epitaxially growing a third semiconductor material layer in the fin trench; and
- recessing the firs dielectric layer to fully exposed the third semiconductor material layer.

13. The method of claim 12, wherein recessing the first dielectric layer in the second trench to expose the portion of the third and fourth fin includes recessing the first dielectric layer to fully expose the third semiconductor material layer.

14. The method of claim 8, wherein forming the first capping layer over the third fin structure and the fourth fin structure in the second region, includes:
- depositing the first capping layer over the first, second, third and fourth fin structures;
- covering the third fin structure and fourth fin structure with a hard mask; and
- removing the first capping layer from the first and second fin structures.

15. The method of claim 8, wherein forming the second dielectric layer over the second capping layer in the first and second trenches includes:
- depositing the second dielectric layer over the substrate, including over the first fin structure, the second fin structure, the second capping layer in both of the third and fourth fin structure, the first trench and second trenches; and
- removing the second dielectric layer from the first fin structure, the second fin structure, the second capping layer in both of the third and fourth fin structure.

16. The method of claim 15, wherein the second dielectric layer is removed by a selective etch process which recesses the second dielectric layer but does not substantially etch the second capping layer.

17. The method of claim 8, further comprising:
- after removing the second capping layer from the first and second fin structures, forming dummy gates in gate regions over the first fin structure, the second fin structure, the third fin structure and the fourth fin structure;
- forming a source/drain (S/D) features in S/D regions over the first fin structure, the second fin structure, the third fin structure and the fourth fin structure; and
- replacing the dummy gates with a high-k/metal gate (HK/MG).

18. A method comprising:
- forming a first fin structure over a substrate;
- forming a second fin structure over the substrate, wherein the second fin structure is formed of a different material than the first fin structure;
- forming a first capping layer over the second fin structure;
- forming a second capping layer over the first fin structure and the first capping layer over the second fin structure, wherein the second capping layer is formed of a different material than the first capping layer;
- forming a dielectric layer over the second capping layer;
- recessing the dielectric layer to expose a portion of the second capping layer; and
- removing the exposed second capping layer such that the first fin structure is exposed and the second fin structure is covered by the first capping layer.

19. The method of claim 18, wherein the second fin structure includes germanium,
wherein the first capping layer includes silicon; and
wherein the second capping layer includes silicon nitride.

20. The method of claim 18, further comprising forming a gate structure over the first fin structure after removing the exposed second capping layer such that the first fin structure is exposed and the second fin structure is covered by the first capping layer.

* * * * *